United States Patent
Kim

(10) Patent No.: US 10,079,247 B2
(45) Date of Patent: Sep. 18, 2018

(54) NONVOLATILE MEMORY DEVICE AND METHOD OF MANUFACTURING THE SAME

(71) Applicant: SK hynix Inc., Icheon (KR)

(72) Inventor: Joong Sik Kim, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/632,146

(22) Filed: Jun. 23, 2017

(65) Prior Publication Data

US 2018/0130823 A1    May 10, 2018

(30) Foreign Application Priority Data

Nov. 9, 2016 (KR) .................. 10-2016-0149002

(51) Int. Cl.
*H01L 27/11597* (2017.01)
*H01L 29/423* (2006.01)
*H01L 29/49* (2006.01)

(52) U.S. Cl.
CPC .. *H01L 27/11597* (2013.01); *H01L 29/42356* (2013.01); *H01L 29/495* (2013.01); *H01L 29/4966* (2013.01)

(58) Field of Classification Search
CPC ........... H01L 27/11597; H01L 29/4966; H01L 29/42356; H01L 29/495
See application file for complete search history.

(56) References Cited

U.S. PATENT DOCUMENTS

| 7,855,457 | B2* | 12/2010 | Mizukami | ......... H01L 27/11578 257/211 |
| 9,337,210 | B2 | 5/2016 | Karda et al. | |
| 2008/0149913 | A1* | 6/2008 | Tanaka | ................ H01L 27/2454 257/5 |
| 2016/0118404 | A1 | 4/2016 | Peng | |
| 2016/0181259 | A1* | 6/2016 | Van Houdt | ......... H01L 27/1159 365/145 |

* cited by examiner

*Primary Examiner* — William Coleman

(57) ABSTRACT

Disclosed is a method of manufacturing a nonvolatile memory device. In the method, a stacked structure is formed on a conductive substrate structure. The stacked structure includes at least one interlayer insulating layer and at least one sacrificial layer alternately stacked with the at least one interlayer insulating layer. A first trench is formed to extend through the stacked structure and to expose the conductive substrate structure. A first gate electrode layer, a dielectric structure, and a channel layer are formed on a side wall of the first trench, the dielectric structure including a ferroelectric layer. At least one recess is formed to expose a side wall of the first gate electrode layer by removing the at least one sacrificial layer. At least one second gate electrode layer is formed by filling the at least one recess with a conductive layer.

9 Claims, 14 Drawing Sheets

NONVOLATILE MEMORY DEVICE AND METHOD OF MANUFACTURING THE SAME

CROSS-REFERENCE TO RELATED APPLICATION

The present application claims priority under 35 U.S.C 119(a) to Korean Patent Application No. 10-2016-0149002, filed on Nov. 9, 2016, which is herein incorporated by reference in its entirety.

BACKGROUND

1. Technical Field

Various embodiments of the present disclosure generally relate to a nonvolatile memory device and a method of manufacturing the same.

2. Related Art

In recent, memory devices that store information in a nonvolatile manner depending on device resistances have been developed. A nonvolatile memory device can reversibly change the resistance state of an internal memory element in response to an externally applied voltage and store different electric signals in a nonvolatile manner on the basis of the changed resistance state. The nonvolatile memory device may, for example, include a magnetic random access memory (magnetic RAM, MRAM), a phase change RAM (PCRAM), a resistive RAM (ReRAM), or the like.

In addition, as the dimensions of design rules decrease and degrees of integration increase, research on the structure of nonvolatile memory devices that can guarantee both structural stability and operational reliability has continued. Recently, as a result of the research, a memory cell having three-dimensional structure has been proposed.

SUMMARY

Disclosed is a method of manufacturing a nonvolatile memory device according to an embodiment of the present disclosure. In the method, a stacked structure is formed on a conductive substrate structure. The stacked structure includes at least one interlayer insulating layer and at least one sacrificial layer alternately stacked with the at least one interlayer insulating layer. A first trench is formed to extend through the stacked structure and to expose the conductive substrate structure. A first gate electrode layer, a dielectric structure, and a channel layer are formed on a side wall of the first trench, the dielectric structure including a ferroelectric layer. At least one recess is formed to expose a side wall of the first gate electrode layer by removing the at least one sacrificial layer. At least one second gate electrode layer is formed by filling the at least one recess with a conductive layer.

Disclosed is a nonvolatile memory device according to another embodiment of the present disclosure. The nonvolatile memory device includes a conductive substrate structure and a stacked structure disposed on the conductive substrate structure. The stacked structure includes at least one interlayer insulating layer and at least one horizontal gate electrode layer which are alternately stacked with the at least one interlayer insulating layer. Further, the nonvolatile memory device includes a first trench extending through the stacked structure and into the conductive substrate structure. Further, the nonvolatile memory device includes a vertical gate electrode layer, a ferroelectric structure, and a channel layer that are disposed on a side wall of the first trench.

BRIEF DESCRIPTION OF THE DRAWINGS

Various embodiments of the disclosure will become more apparent in view of the attached drawings and accompanying detailed description, in which.

DETAILED DESCRIPTION OF THE EMBODIMENTS

Figure 1:
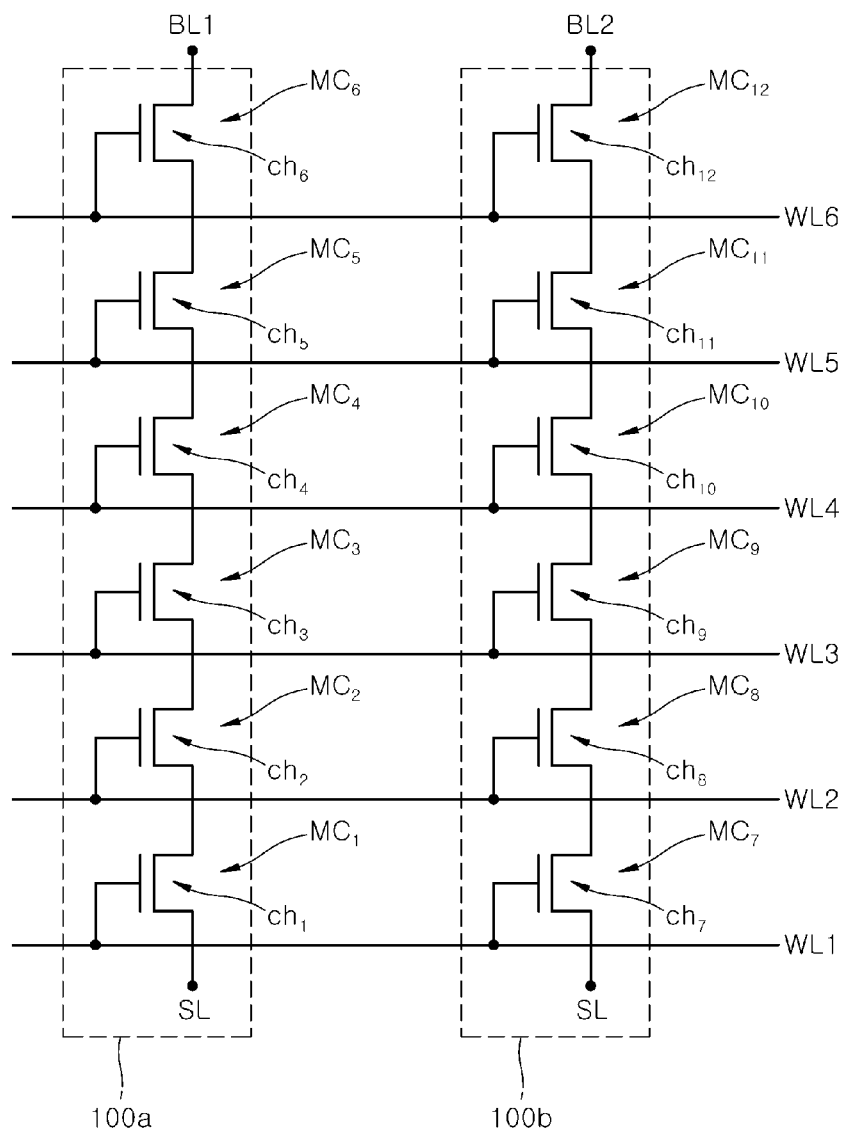
FIG. 1 is a circuit diagram illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. The drawings are described from the perspective of an observer's point of view overall. If an element is referred to be located on another element, it may be understood that the element is directly located on the other element, or an additional element may be interposed between the element and the other element. The same reference numerals refer to the same elements throughout the specification.

In addition, expression of the singular form should be understood to include the plural forms unless clearly used otherwise in context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

Further, in performing a method or a manufacturing method, a sequence of steps constituting the method can take place in a different order than a specific sequence that is described explicitly in the disclosure. In other words, the steps may be performed in the stated order, may be performed substantially at the same time, or may be performed in a reverse order of the stated order.

Embodiments of the present disclosure include a nonvolatile memory device employing a ferroelectric material layer as a gate dielectric layer, and a method of manufacturing the same.

FIG. 1 is a circuit diagram illustrating a nonvolatile memory device 10 according to an embodiment of the present disclosure. Referring to FIG. 1, the nonvolatile memory device 10 may include a cell array including a plurality of strings, e.g., first and second strings 100a and 100b. An end of each of the strings 100a and 100b may be connected to a common source line SL, and the other ends of the strings 100a and 100b may be connected to different bit lines BL1 and BL2, respectively. In FIG. 1, although the first string 100a and the second string 100b are pictured for convenience of explanation, embodiments are not limited thereto. The number of the strings constituting the cell array may be different than two.

The first string 100a may include first to sixth memory cell transistors $MC_1$, $MC_2$, $MC_3$, $MC_4$, $MC_5$, and $MC_6$, which are connected to each other in series. The second string 100b may include seventh to twelfth memory cell transistors $MC_7$, $MC_8$, $MC_9$, $MC_{10}$, $MC_{11}$, and $MC_{12}$, which are connected to each other in series. In FIG. 1, although each of the first and second strings 100a and 100b is illustrated with six cell transistors, embodiments are not limited thereto. The number of the cell transistors in each of the first and second strings 100a and 100b may be different than six.

The first to sixth memory cell transistors $MC_1$, $MC_2$, $MC_3$, $MC_4$, $MC_5$, and $MC_6$ may be connected to first to sixth word lines WL1, WL2, WL3, WL4, WL5, and WL6, respectively. Likewise, the seventh to twelfth memory cell transistors $MC_7$, $MC_8$, $MC_9$, $MC_{10}$, $MC_{11}$, and $MC_{12}$ may be connected to the first to sixth word lines WL1, WL2, WL3, WL4, WL5, and WL6, respectively.

In an embodiment, each of the first to twelfth memory cell transistors $MC_1$ to $MC_{12}$ may include at least one dielectric structure including a ferroelectric material layer that functions as a gate dielectric layer. When a gate voltage is applied to a gate electrode layer of a selected one of the first to twelfth memory cell transistors $MC_1$ to $MC_{12}$ through one of the first to sixth word lines WL1, WL2, WL3, WL4, WL5, and WL6, an electrical dipole in the ferroelectric material layer of the selected one of the first to twelfth memory cell transistors $MC_1$ to $MC_{12}$ may be polarized in a predetermined direction. The gate voltage may be higher than a threshold voltage. Further, the ferroelectric material layer of the selected one of the first to twelfth memory cell transistors $MC_1$ to $MC_{12}$ can maintain the polarization state of the electrical dipole after the application of the gate voltage has ended. According to the polarization state of the ferroelectric material layer, a channel resistance Ch of the selected one of the first to twelfth memory cell transistors $MC_1$ to $MC_{12}$ may be changed. Here, the channel resistance Ch may be defined as an electrical resistance affected by carriers conducting along a channel layer between a source electrode and a drain electrode. Accordingly, each of the first to twelfth memory cell transistors $MC_1$ to $MC_{12}$ may have a channel resistance. The polarization states of the electric dipoles in the ferroelectric material layer in each of the first to twelfth memory cell transistors $MC_1$ to $MC_{12}$ are written in a nonvolatile manner, such that the channel resistances $Ch_1$ to $Ch_{12}$ respectively corresponding to the first to twelfth memory cell transistors $MC_1$ to $MC_{12}$ can be stored in a nonvolatile manner.

According to a driving method of the nonvolatile memory device 10, a gate voltage may be applied from the first to sixth word lines WL1, WL2, WL3, WL4, WL5, and WL6, and may be independently controlled. Accordingly, the channel resistance of each of the memory cell transistors $MC_1$, $MC_2$, $MC_3$, $MC_4$, $MC_5$, and $MC_6$ constituting the first string 100a may be independently modified. Meanwhile, a total channel resistance of the first string 100a may be determined as a sum of the channel resistances of the memory cell transistors $MC_1$, $MC_2$, $MC_3$, $MC_4$, $MC_5$, and $MC_6$, which are connected to each other in series. As a result, a plurality of different electric signals can be stored in the first string 100a by independently controlling the gate voltages applied to the gate electrode layers of the different memory cell transistors $MC_1$, $MC_2$, $MC_3$, $MC_4$, $MC_5$, and $MC_6$.

Similarly, a plurality of different electric signals can be stored in the second string 100b by independently controlling the gate voltages applied to the gate electrode layers of the different memory cell transistors $MC_7$, $MC_8$, $MC_9$, $MC_{10}$, $MC_{11}$, and $MC_{12}$.

According to an embodiment, a nonvolatile memory device may be implemented in a three-dimensional structure including a plurality of cell transistors that are vertically stacked between a source line and a bit line, as described below.

Figure 2:
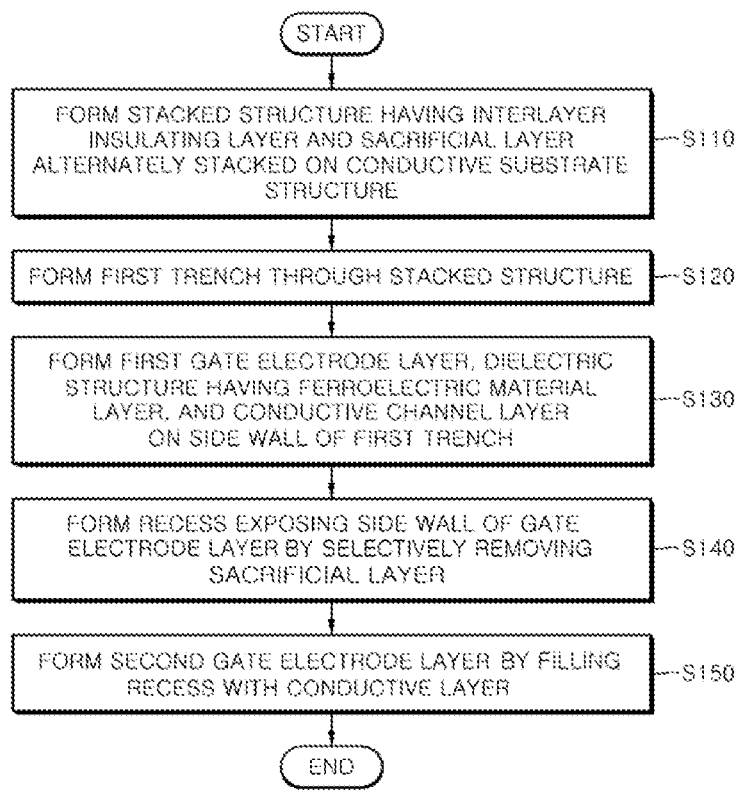
FIG. 2 is a flow chart illustrating a method of manufacturing a nonvolatile memory device according to an embodiment of the present disclosure.

FIG. 2 is a flow chart illustrating a method of manufacturing a nonvolatile memory device according to an embodiment of the present disclosure.

Referring to FIG. 2, in operation S110, a stacked structure may be formed on a conductive substrate structure. The stacked structure may include at least one interlayer insulating layer and at least one sacrificial layer that are alternately stacked. The at least one interlayer insulating layer may have an etching selectivity with respect to the at least one sacrificial layer. The at least one interlayer insulating layer and the at least one sacrificial layer may have amorphous phases.

In operation S120, a first trench may be formed through the stacked structure. The conductive substrate structure may be exposed by the first trench. In addition, sides of the at least one interlayer insulating layer and the at least one sacrificial layer may be exposed on side walls of the first trench. In an embodiment, the first trench extends into the conductive substrate structure.

In operation S130, a first gate electrode layer, one or more dielectric structures each including a ferroelectric material layer, and a channel layer may be formed on the side walls of the first trench. In an embodiment, operation S130 may be performed as follows. First, the first gate electrode layer is formed along an inner wall of the first trench. The first gate electrode layer may have a crystalline phase. An amorphous ferroelectric material layer is formed on the first gate electrode layer. The amorphous ferroelectric material layer is crystalized by performing a heat treatment on the amorphous ferroelectric material layer using the first gate electrode layer as a capping layer. Subsequently, a conductive channel layer is formed on the crystalized ferroelectric material layer. Next, the first gate electrode layer, the crystalized ferroelectric material layer, and the conductive channel layer formed on the bottom of the first trench are selectively etched, so that the conductive substrate structure is exposed.

In an embodiment, when performing the heat treatment on the amorphous ferroelectric material layer, the first gate electrode layer may function as a capping layer for the amorphous ferroelectric material layer. When the amorphous ferroelectric material layer is in contact with a certain kind of capping layer while being crystallized by the heat treatment, the ferroelectric material layer can become ferroelectric by the crystallization process.

Several theories may contribute to the development of ferroelectric characteristics in the ferroelectric material layer when the capping layer having a crystalline phase is in contact with the amorphous ferroelectric material layer during crystallization. In an example of the theories, the capping layer can cause the ferroelectric material layer to adopt a ferroelectric structure by imposing stress on an interface with the ferroelectric material layer because of a different lattice constant with each other. In another example of the theories, the capping layer can suppress dopant elements in the ferroelectric material layer from being diffused out of the ferroelectric material layer, so that the ferroelectric material layer can maintain a ferroelectric atomic arrangement. As a result, after the ferroelectric material layer is crystalized, the ferroelectric material layer can be ferroelectric.

In an embodiment of the present disclosure, the first gate electrode layer may, for example, include one or more of a silicon layer, a metal layer, a metal nitride layer, and a metal silicide layer, which are doped with n-type dopants. The ferroelectric material layer may, for example, include one or more of hafnium oxide, hafnium silicon oxide, zirconium oxide, and zirconium silicon oxide. The ferroelectric material layer may include a dopant including one or more of copper (Cu), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Gd). The conductive channel layer may, for example, include a silicon layer doped with n-type dopants.

In an embodiment of the present disclosure, the first gate electrode layer may entirely cover the ferroelectric material layer when the ferroelectric material layer is in the amorphous state. Therefore, the first gate electrode layer can function as a capping layer when the ferroelectric material layer is being crystallized by the heat treatment. As a result, the ferroelectric material layer may be ferroelectric after crystallization.

According to some embodiments, heat-treating the amorphous ferroelectric material layer may be performed after forming the conductive channel layer on the amorphous ferroelectric material layer. In this case, both the first gate electrode layer and the conductive channel layer may function as the capping layers for crystallizing the ferroelectric material layer during the heat treatment.

In operation S140, at least one recess exposing side walls of the first gate electrode layer is formed by selectively removing the at least one sacrificial layer in the stacked structure. In an embodiment, the operation for forming the at least one recess may proceed as follows. First, a second trench is formed through the stacked structure, which exposes the conductive substrate structure, the second trench being spaced apart from the first trench in a lateral (or horizontal) direction. In an embodiment, the second trench may extend into the conductive substrate structure.

Next, the at least one recess is formed when the at least one sacrificial layer exposed to the second trench is wet-etched. The at least one sacrificial layer is etched until the side walls of the first gate electrode layer formed in the first trench are exposed. After the wet-etch process, the at least one interlayer insulating layer, which is included in the stacked structure and has the etch selectivity with respect to the at least one sacrificial layer, may remain next to and/or between the at least one recess.

In operation S150, at least one a second gate electrode layer is formed by filling the at least one recess with a conductive layer. The conductive layer may, for example, include one or more of a metal, a metal nitride, a metal carbide, and a metal silicide. The at least one second gate electrode layer may contact the first gate electrode layer in the lateral direction.

Although not illustrated in FIG. 2, in an embodiment, an operation for forming a source connection pattern, which is electrically isolated from the second gate electrode layer and is configured to connect the conductive substrate structure to the source line in the second trench, may be additionally performed. In addition, an operation for forming a bit line connection pattern, connecting the channel layer to the bit line on the first trench, may be additionally performed.

By performing the above-described processes, a nonvolatile memory device including a plurality of memory cell transistors stacked in a vertical direction on the conductive substrate structure can be formed.

FIGS. 3 to 13 are cross-sectional views illustrating a method of manufacturing a nonvolatile memory device according to an embodiment of the present disclosure. FIG. 14 is a cross-sectional view illustrating a method of manufacturing a nonvolatile memory device according to another embodiment of the present disclosure.

Figure 3:
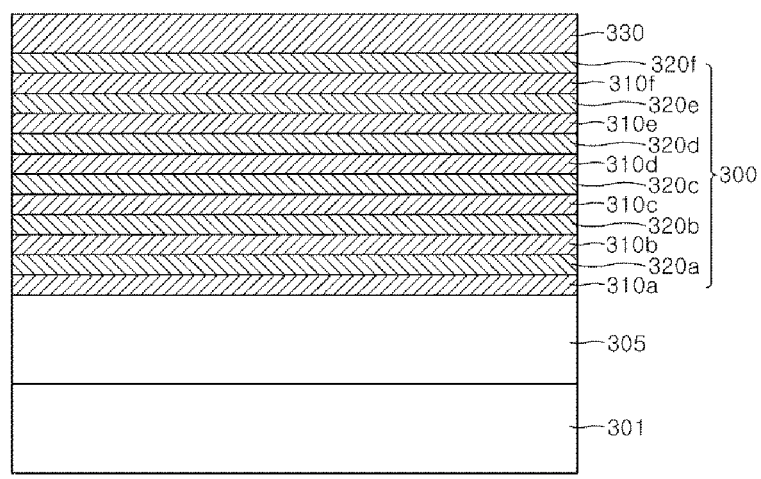
FIGS. 3 to 13 are cross-sectional views illustrating a method of manufacturing a nonvolatile memory device according to an embodiment of the present disclosure.

Referring to FIG. 3, a substrate 301 is prepared. In an embodiment, the substrate 301 may be a semiconductor substrate. The semiconductor substrate may, for example, be a silicon (Si) substrate, a gallium arsenide (GaAs) substrate, an indium phosphide (InP) substrate, a germanium (Ge) substrate, or a silicon germanium (SiGe) substrate. The semiconductor substrate may have a specific conductivity by being doped with n-type or p-type dopants. In another embodiment, the substrate 301 may be an insulating substrate, such as a silicon-on-insulator substrate. In yet another embodiment, the substrate 301 may be a conductive substrate, such as a metal substrate.

A base conductive layer 305 is formed on the substrate 301. The base conductive layer 305 may, for example, include a metal, a metal nitride, or a metal silicide. In an embodiment, when the substrate 301 is a semiconductor substrate including a silicon material, the base conductive layer 305 may be a semiconductor material layer including a silicon layer doped with n-type dopants. The base conductive layer 305 may be formed by, for example, a known chemical vapor deposition method, an atomic layer deposition method, or a sputtering method. The substrate 301 and base conductive layer 305 may collectively constitute the conductive substrate structure described in the flowchart of FIG. 2.

Although not illustrated, the substrate 301 may include a well, which is formed by doping n-type or p-type dopants into the substrate 301. Various types of integrated circuits may be disposed between the substrate 301 and the base conductive layer 305.

A stacked structure 300 may be formed on the base conductive layer 305. The stacked structure 300 may be formed by alternately stacking interlayer insulating layers 310a, 310b, 310c, 310d, 310e, and 310f with sacrificial layers 320a, 320b, 320c, 320d, 320e, and 320f. The interlayer insulating layers 310a, 310b, 310c, 310d, 310e, and 310f may have an etching selectivity with respect to the sacrificial layers 320a, 320b, 320c, 320d, 320e, and 320f. The interlayer insulating layers 310a, 310b, 310c, 310d, 310e, and 310f and the sacrificial layers 320a, 320b, 320c, 320d, 320e, and 320f may have amorphous phases. For example, each of the interlayer insulating layers 310a, 310b, 310c, 310d, 310e, and 310f may include silicon oxide, and each of the sacrificial layers 320a, 320b, 320c, 320d, 320e, and 320f may include a silicon nitride. In another example, each of the interlayer insulating layers 310a, 310b, 310c, 310d, 310e, and 310f may include a silicon nitride, and each of the sacrificial layers 320a, 320b, 320c, 320d, 320e, and 320f may include silicon oxide.

In an embodiment, when the stacked structure 300 is formed on the base conductive layer 305, a first interlayer insulating layer 310a may be formed on the base conductive layer 305, and then a first sacrificial layer 320a may be formed on the first interlayer insulating layer 310a. Further, the remaining interlayer insulating layers 310b, 310c, 310d, 310e, and 310f and the remaining sacrificial layers 320b, 320c, 320d, 320e, and 320f may be alternately and sequentially stacked on the sacrificial layer 320a.

Although FIG. 1 illustrates six of the interlayer insulating layers 310a, 310b, 310c, 310d, 310e, and 310f, and six of the sacrificial layers 320a, 320b, 320c, 320d, 320e, and 320f, embodiments are not limited thereto. The number of stacked layers of the interlayer insulating layer and the sacrificial layer can be different than six.

A first upper insulating layer 330 may be formed on the uppermost sacrificial layer 320f of the stacked structure 300. The first upper insulating layer 330 may have an etch selectivity with respect to the sacrificial layers 320a, 320b, 320c, 320d, 320e, and 320f. For example, the first upper insulating layer 330 may include the same material as the interlayer insulating layers 310a, 310b, 310c, 310d, 310e, and 310f. The first upper insulating layer 330 may be thicker than each of the interlayer insulating layers 310a, 310b, 310c, 310d, 310e, and 310f.

Each of the interlayer insulating layers 310a, 310b, 310c, 310d, 310e, and 310f, each of the sacrificial layers 320a, 320b, 320c, 320d, 320e, and 320f, and the first upper insulating layer 330 may be formed using a chemical vapor deposition method, an atomic layer deposition method, a coating method, or the like.

Figure 4:
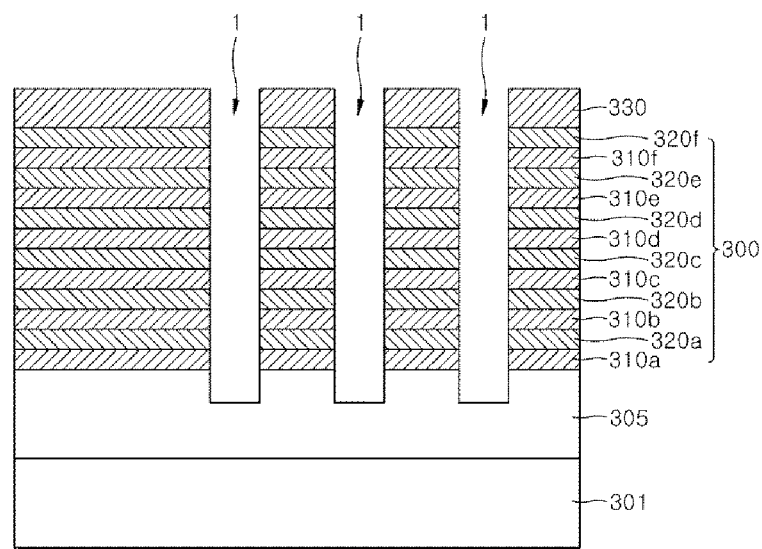

Referring to FIG. 4, a first trench 1 may be formed through the stacked structure 300 and the first upper insulating layer 330, and may expose the base conductive layer 305. In an embodiment, the first trench 1 may be formed by anisotropically etching the stacked structure 300 and the first upper insulating layer 330. For example, the stacked structure 300 may be anisotropic etched by performing a dry etch method using plasma. As illustrated, a side wall of the first trench 1 may expose sides of the interlayer insulating layers 310a, 310b, 310c, 310d, 310e, and 310f and sides of the sacrificial layers 320a, 320b, 320c, 320d, 320e, and 320f. In an embodiment, the first trench 1 may extend into the base conductive layer 305 by a predetermined depth.

Figure 5:
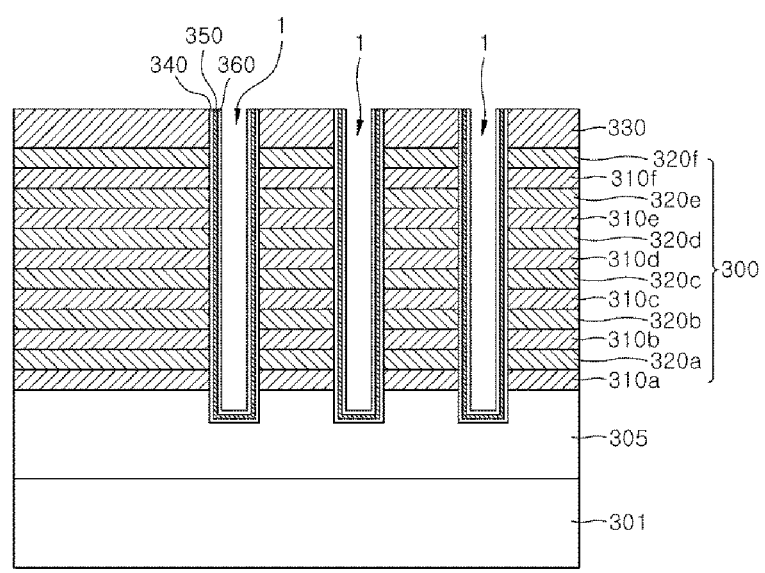

Referring to FIG. 5, a doped first silicon layer 340 may be formed on an inner wall of the first trench 1. The doped first silicon layer 340 may have a crystalline phase. For example, the first silicon layer 340 may include a silicon base material layer and n-type dopants that are doped into the silicon base material layer at a concentration of about $10^{18}*cm^{-3}$ or more. In another example, the first silicon layer 340 may include a silicon base material layer doped with n-type dopants at a concentration of at least about $10^{20}*cm^{-3}$. The n-type dopant may, for example, include phosphorus (P), arsenide (As), or the like. The first silicon layer 340 may, for example, be formed using a chemical vapor deposition method or an atomic layer deposition method.

An amorphous ferroelectric material layer 350 may be formed on the first silicon layer 340. The ferroelectric material layer 350 may, for example, include one or more of hafnium oxide, hafnium silicon oxide, zirconium oxide, and zirconium silicon oxide. The ferroelectric material layer 350 may include a dopant that includes, for example, one or more of copper (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Gd). The ferroelectric material layer 350 may, for example, be formed using a chemical vapor deposition method or an atomic layer deposition method.

The ferroelectric material layer 350 may not be ferroelectric in an amorphous state. Accordingly, the ferroelectric characteristics of the ferroelectric material layer 350 may be increased by heat-treating the ferroelectric material layer 350, in order to crystalizing the ferroelectric material layer 350. In an embodiment, the heat treatment may include a rapid thermal process performed at a temperature of about 400° C. to 1,200° C. In another embodiment, the heat treatment may be performed at a temperature of about 600° C. to 1,000° C.

Meanwhile, during the heat treatment on the amorphous ferroelectric material layer 350, the first silicon layer 340 may function as a capping layer for the ferroelectric material layer 350. When the amorphous ferroelectric material layer 350 is covered by a predetermined type of capping layer while being crystallized by the heat treatment, the ferroelectric characteristics of the ferroelectric material layer 350 can be improved.

Several theories may contribute to the development of ferroelectric characteristics in the ferroelectric material layer when the capping layer is in contact with the amorphous ferroelectric material layer during crystallization. In an example of the above-mentioned theories, the capping layer can cause the ferroelectric material layer 350 to adopt a ferroelectric crystal structure by imposing stress on an interface with the ferroelectric material layer 350. In another example of the theories, the capping layer may suppress dopant elements in the ferroelectric material layer 350 from being diffused out of the ferroelectric material layer 350, so that the ferroelectric material layer 350 maintains a ferroelectric atomic arrangement. As a result, the ferroelectric material layer may be ferroelectric after being crystallized.

In an embodiment, if the ferroelectric material layer 350 includes hafnium oxide, and the heat treatment is performed in the presence of the capping layer, the hafnium oxide may be crystallized into a ferroelectric, orthorhombic phase. On the other hand, when the heat treatment is performed in the absence of the capping layer, the hafnium oxide may be crystallized into a non-ferroelectric, monoclinic phase.

In an embodiment of the present disclosure, the first silicon layer 340 may entirely cover the ferroelectric material layer 350 when the ferroelectric material layer 350 is in the amorphous state. Accordingly, the first silicon layer 340 can faithfully perform its role as a capping layer when the ferroelectric material layer 350 is crystalized by the heat treatment. As a result, the ferroelectric material layer 350 may be ferroelectric after crystallization. In contrast, if the first silicon layer 340 is not present, the ferroelectric material layer 350 may directly contact the interlayer insulating layers 310a, 310b, 310c, 310d, 310e, and 310f, the sacrificial layers 320a, 320b, 320c, 320d, 320e, and 320f, and the first upper insulating layer 330, which are exposed to the side wall of the first trench 1. The interlayer insulating layers 310a, 310b, 310c, 310d, 310e, and 310f, the sacrificial layers 320a, 320b, 320c, 320d, 320e, and 320f, and the first upper insulating layer 330, which include, for example, silicon oxide or silicon nitride, cannot perform the role as the above-described capping layer when the ferroelectric material layer 350, which includes, for example, hafnium oxide, hafnium silicon oxide, zirconium oxide, or zirconium silicon oxide, is heat treated. Accordingly, if the first silicon layer 340 is not present, the ferroelectric material layer 350 may not be ferroelectric, even after the ferroelectric material layer 350 is crystalized.

Meanwhile, in this embodiment, although the first silicon layer 340 including the silicon base material layer is used as the capping layer, in some other embodiments, a metal, a conductive metal oxide, a conductive metal nitride, a conductive metal silicide, or the like may be used as the capping layer. However, if a metal is used as the capping layer, the metal may contaminate another structure in the nonvolatile memory device during a subsequent thermal process, etching process, or cleaning process.

Referring to FIG. 5, a doped second silicon layer 360 may be formed on the crystallized ferroelectric material layer 350. The doped second silicon layer 360 may have a crystalline phase. For example, the second silicon layer 360 may include a silicon base material, and n-type dopants doped in the silicon base material layer at a concentration of at least about $10^{16}*cm^{-3}$. For example, the n-type dopant may include phosphorus (P), arsenide (As), or the like. The second silicon layer 360 may, for example, be formed using a chemical vapor deposition method or an atomic layer deposition method.

According to some embodiments, heat-treating the ferroelectric material layer 350 may be performed after forming the second silicon layer 360 on the ferroelectric material layer 350 having the amorphous phase. In this case, both the first silicon layer 340 and the second layer 360 may function as the capping layers for crystallizing the ferroelectric material layer 350 during the heat treatment.

Figure 6:
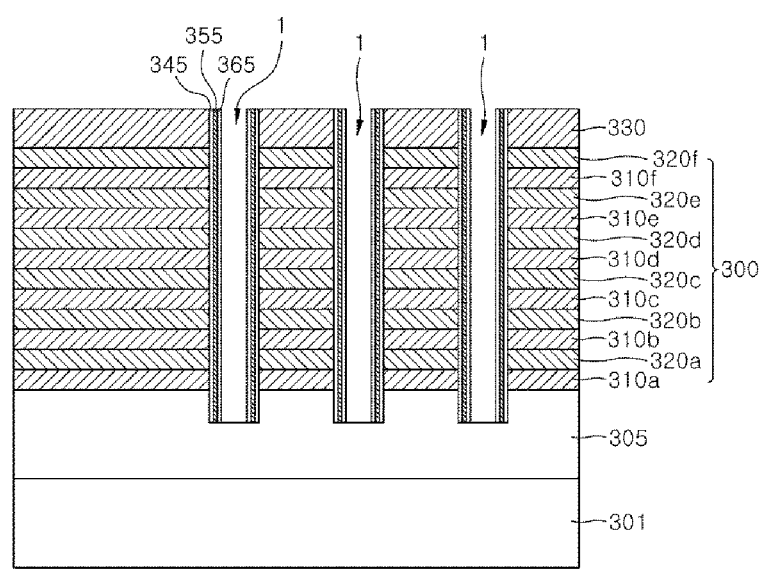

Referring to FIG. 6, the base conductive layer 305 may be exposed at the bottom of the trench 1, by anisotropically etching the first silicon layer 340, the ferroelectric material layer 350, and the second silicon layer 360 in the first trench 1. In an embodiment, the anisotropic etch may be carried out by performing a dry etch method using plasma. In an embodiment, the anisotropic etch may be carried out by performing an etch back method.

As a result of the anisotropic etch, the base conductive layer 305 may be exposed at the bottom of the first trench 1, and a first silicon pattern layer 345, a ferroelectric layer 355, and a second silicon pattern layer 365 may be formed on the side walls of the first trench 1. The first silicon pattern layer 345, the ferroelectric layer 355, and the second silicon pattern layer 365 may function as a first gate electrode layer, a gate dielectric layer, and a channel layer of a memory cell transistor, respectively.

According to some embodiments, as illustrated in FIG. 14, a silicon oxide pattern layer 352 may be interposed between the first silicon pattern layer 345 and the ferroelectric layer 355. The silicon oxide pattern layer 352 of FIG. 14 can improve interfacial stability between the first silicon pattern layer 345 and the ferroelectric layer 355.

The silicon oxide pattern layer 352 may be formed as follows. First, after forming the first silicon layer 340 described above with reference to FIG. 5, a silicon oxide layer may be formed on the first silicon layer 340. Then, the ferroelectric material layer 350 may be formed on the silicon oxide layer, and the ferroelectric material layer 350 may be crystallized by being subjected to a heat treatment. Then, the second silicon layer 360 may be formed on the ferroelectric material layer 350. The first silicon layer 340, the silicon oxide layer, the ferroelectric material layer 350, and the second silicon layer 360 may be anisotropically etched and removed from the bottom of the first trench 1. As a result, a structure may be formed, in which the first silicon pattern layer 345, the silicon oxide pattern layer 352, the ferroelectric layer 355, and the second silicon pattern layer 365 are sequentially stacked on the side walls of the first trench 1.

Although not illustrated, in some other embodiments, a silicon oxide pattern layer may be formed between the ferroelectric is layer 355 and the second silicon pattern layer 365. Further, in some other embodiments, a silicon oxide pattern layer may be formed both between the first silicon pattern layer 345 and the ferroelectric layer 355, and between the ferroelectric layer 355 and the second silicon pattern layer 365.

Figure 7:
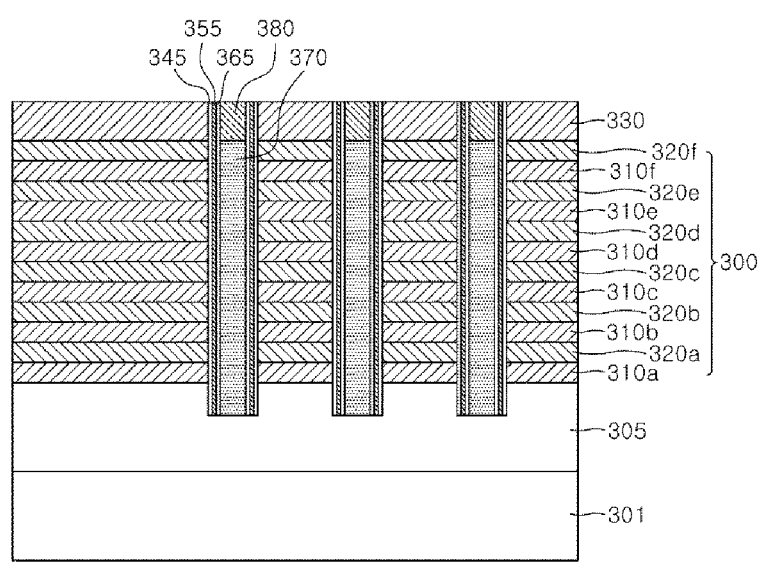

Referring to FIG. 7, the first trench 1 may be filled with an insulating material layer 370. The trench may be filled with the insulating material layer 370, for example, by a chemical vapor deposition method, a coating method, or the like. The insulating material layer 370 may, for example, include silicon oxide, silicon nitride, silicon oxy-nitride, or the like.

After filling the first trench 1 with the insulating material layer 370, a planarization process for removing a portion of the insulating material layer 370 formed on the first upper insulating layer 330 may be carried out. Accordingly, an upper surface of the insulating material layer 370 and an upper surface of the first upper insulating layer 330 may be positioned on the same plane. The planarization process may be carried out, for example, using a chemical mechanical polishing method, an etch back method, or the like.

Subsequently, the insulating material layer 370 may be etched back, such that the insulating material layer 370 may be recessed into the first trench 1. Next, a channel contact layer 380 may be formed by filling the recess above the insulating material layer 370 with a conductive layer. The recess may be filled with the conductive layer, for example, using a chemical vapor deposition method, a coating method, or the like. A portion of the conductive layer formed on the first upper insulating layer 330 may be removed using a planarization process. Accordingly, an upper surface of the channel contact layer 380 and the upper surface of the first upper insulating layer 330 may be positioned on the same plane.

The channel contact layer 380 may, for example, include a metal or a metal nitride. The channel contact layer 380 may reduce a resistance between the channel layer 365 and a bit line connection pattern (e.g., 450 of FIG. 13), which is formed later.

Figure 8:
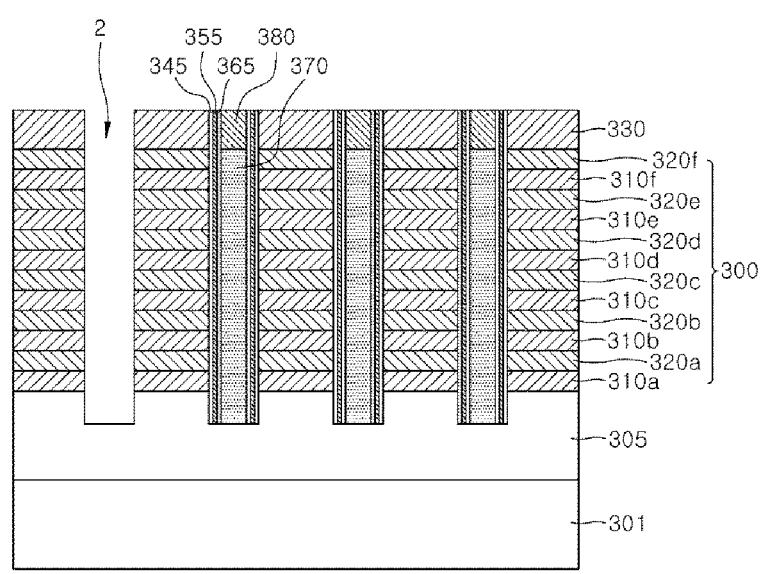

Referring to FIG. 8, a second trench 2 exposing the base conductive layer 305 may be formed through the stacked structure 300 and the first upper insulating layer 330. Side walls of the second trench 2 may expose side walls of the interlayer insulating layers 310a, 310b, 310c, 310d, 310e, and 310f, side walls of the sacrificial layers 320a, 320b, 320c, 320d, 320e, and 320f, and side walls of the first upper insulating layer 330. The second trench 2 may be spaced apart from the first trench 1 in a lateral direction. In an embodiment, the second trench 2 may extend into the base conductive layer 305 by a predetermined depth.

Figure 9:
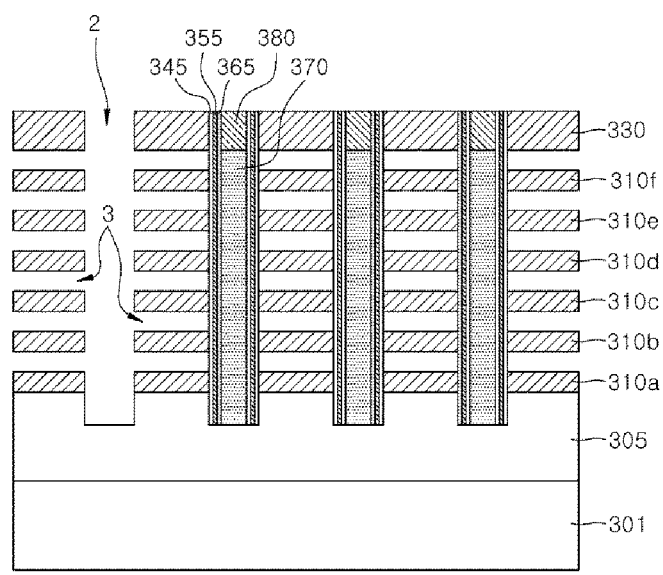

Referring to FIG. 9, the sacrificial layers 320a, 320b, 320c, 320d, 320e, and 320f exposed by the second trench 2 may be removed. In an embodiment, the sacrificial layers 320a, 320b, 320c, 320d, 320e, and 320f may be removed by a wet etch method using an etch solution that has an etch selectivity with respect to the interlayer insulating layers 310a, 310b, 310c, 310d, 310e, and 310f and the first upper insulating layer 330. As a result, recesses 3 exposing side walls of the first silicon pattern layer 345 formed in the first trench 1 may be formed. Hereinafter, for convenience of explanation, the first silicon pattern layer 345 will be referred to as a "first gate electrode layer."

Figure 10:
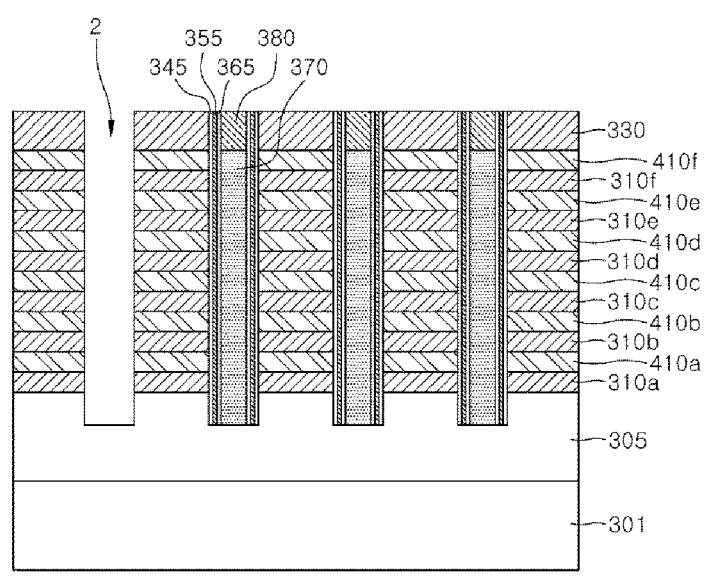

Referring to FIG. 10, second gate electrode layers 410a, 410b, 410c, 410d, 410e, and 410f may be formed by filling the recesses 3 with a conductive layer. The second gate electrode layers 410a, 410b, 410c, 410d, 410e, and 410f may contact the side wall of the first gate electrode layer 345. The second gate electrode layers 410a, 410b, 410c, 410d, 410e, and 410f may, for example, include one or more of a metal, a metal nitride, a metal carbide, and a metal silicide. The second gate electrode layers 410a, 410b, 410c, 410d, 410e and, 410f may, for example, include one or more of tungsten (W), titanium (Ti), copper (Cu), tungsten nitride, titanium nitride, tantalum nitride, tungsten carbide, titanium carbide, tungsten silicide, titanium silicide, and tantalum silicide.

Figure 11:
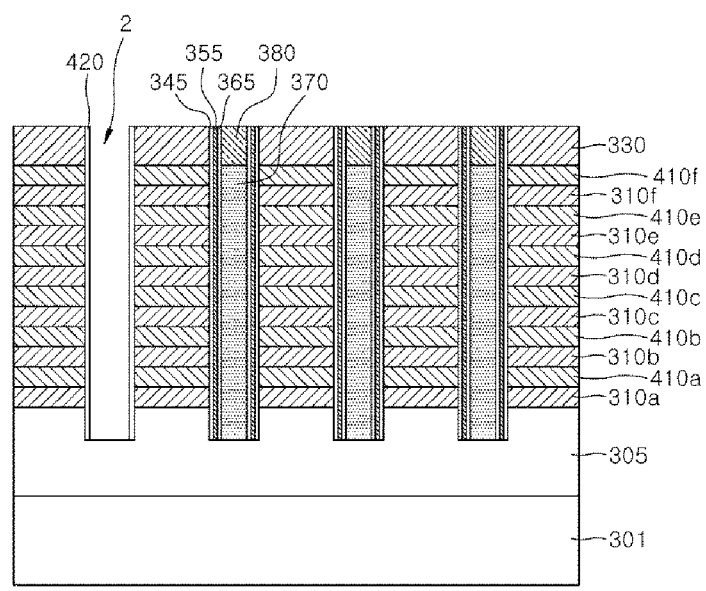

Referring to FIG. 11, a liner insulating layer 420 may be formed on the side walls of the second trench 2. To form the liner insulating layer 420, an insulating layer is formed along an inner wall of the second trench 2, and a portion of the insulating layer formed on a bottom surface of the second trench 2 is removed by anisotropically etching the insulating layer. The insulating layer used to form the liner insulating layer 420 may, for example, be formed using a chemical vapor deposition method or an atomic layer deposition method.

Figure 12:
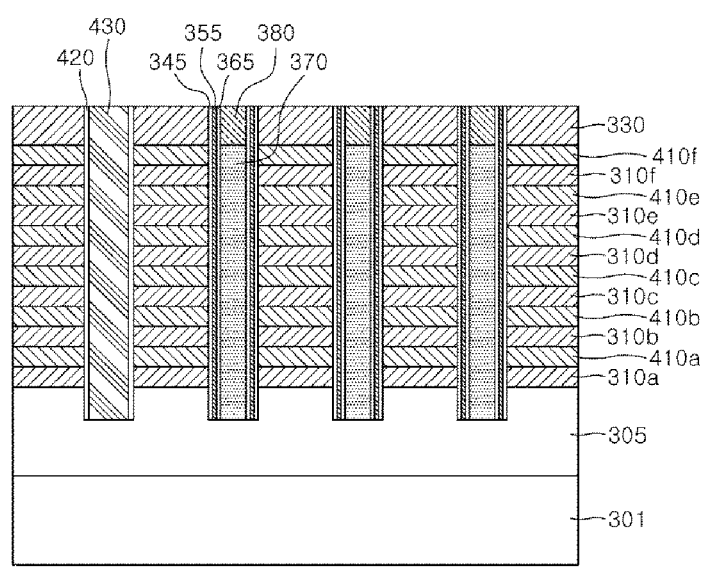

Referring to FIG. 12, the second trench 2, which is lined with the liner insulating layer 420, may be filled with a conductive layer. Next, a portion of the conductive layer formed outside the second trench 2 may be removed, and the remaining portion of the conductive layer may be a first source line connection pattern 430. The first source line connection pattern 430 may, for example, include one or more of a metal, a metal nitride, a metal carbide, and a metal silicide. The first source line connection pattern 430 may, for example, include one or more of tungsten (W), titanium (Ti), copper (Cu), tungsten nitride, titanium nitride, tantalum nitride, tungsten carbide, titanium carbide, tungsten silicide, titanium silicide, and tantalum silicide.

The first source line connection pattern 430 may be electrically insulated from the second gate electrode layer 410a, 410b, 410c, 410d, 410e, and 410f by the liner insulating layer 420.

Figure 13:
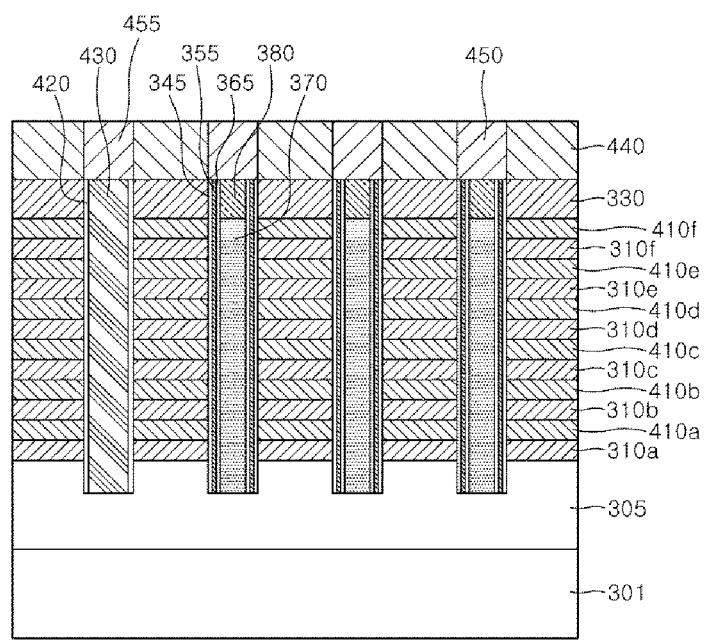
Figure 14:
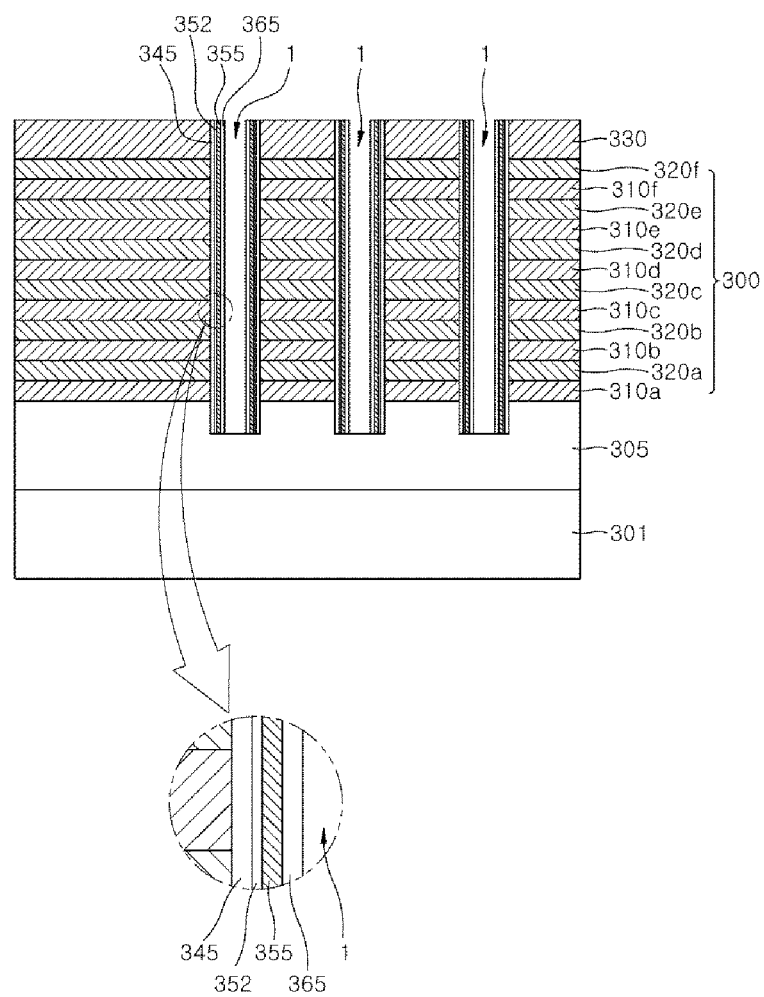
FIG. 14 is a cross-sectional view partially illustrating a method of manufacturing a nonvolatile memory device according to another embodiment of the present disclosure.

Referring to FIG. 13, a second upper insulating layer 440 may be formed over the first upper insulating layer 330. The second upper insulating layer 440 may, for example, include silicon oxide, silicon nitride, or silicon oxy-nitride. The second upper insulating layer 440 may, for example, be formed by a chemical vapor deposition method or a coating method.

Subsequently, a bit line connection pattern 450, which is electrically connected to the channel contact layer 380, may be formed through the second upper insulating layer 440. In addition, a second source line connection pattern 455, which is electrically connected to the first source line connection pattern 430, may be formed through the second upper insulating layer 440.

In an embodiment, the process of forming the bit line connection pattern 450 and the second source line connection pattern 455 may be performed as follows. First, contact patterns, which expose the channel contact layer 380 and the first source line connection pattern 430, may be formed by selectively etching the second upper insulating layer 440. Next, spaces between the contact patterns may be filled with a conductive layer. The conductive layer may, for example, include one or more of tungsten (W), titanium (Ti), copper (Cu), tungsten nitride, titanium nitride, tantalum nitride, tungsten carbide, titanium carbide, tungsten silicide, titanium silicide, and tantalum silicide.

The first and second source line connection patterns 430 and 455 may electrically connect the base conductive layer 305 to a source line (not illustrated) of the nonvolatile memory device. The channel contact layer 380 and the bit line connection pattern 450 may electrically connect the channel layer 365 to a bit line (not illustrated) of the nonvolatile memory device.

By performing the above-described processes, the nonvolatile memory device according to an embodiment of the present disclosure can be manufactured. According to the embodiment, a method of manufacturing a nonvolatile memory device of a three-dimensional structure having a ferroelectric material layer as a gate dielectric layer can be provided. Specifically, a gate electrode layer may be disposed in a vertical direction, and may be configured to cover the ferroelectric material layer, so that the gate electrode layer can effectively perform the role of a capping layer for the ferroelectric material layer during a heat treatment that crystallizes the ferroelectric material layer. Accordingly, after the heat treatment is performed, the ferroelectric characteristics of the ferroelectric material layer can be effectively improved. As a result, the nonvolatile memory device described above may be structurally and functionally reliable. In addition, the method of manufacturing the nonvolatile memory device described above may ensure the structural and functional reliability of the nonvolatile memory device.

Hereinafter, a nonvolatile memory device according to an embodiment of the present disclosure will be described with reference to FIG. 13. The nonvolatile memory device includes a plurality of memory cell transistors stacked in a vertical direction on a substrate.

Referring to FIG. 13, the nonvolatile memory device may include a substrate 301, a base conductive layer 305 disposed on the substrate 301, and a stacked structure 300 disposed on the base conductive layer 305. The stacked structure 300 may include interlayer insulating layers 310a, 310b, 310c, 310d, 310e, and 310f and lateral (or horizontal) gate electrode layers 410a, 410b, 410c, 410d, 410e, and 410f, which are alternately stacked. The horizontal gate electrode layers 410a, 410b, 410c, 410d, 410e, and 410f may be referred to as "second gate electrode layers."

In addition, the nonvolatile memory device may include a first trench through the stacked structure 300 to the base conductive layer 305. The nonvolatile memory device may further include a vertical gate electrode layer 345, one or more dielectric structures that each include a ferroelectric layer 355, and a channel layer 365, which are sequentially disposed on a side wall of the first trench. The vertical gate electrode layer 345 may be referred to as a "first gate electrode layer."

In addition, the nonvolatile memory device may include a second trench through the stacked structure 300 to the base conductive layer 305, and first and second source line connection patterns 430 and 455, which are disposed in and above the second trench, respectively. The first and second source line connection patterns 430 and 455 are separate and insulated from the vertical gate electrode 345, and are insulated from the horizontal gate electrode layers 410a, 410b, 410c, 410d, 410e, and 410f by a liner insulating layer 420. The first and second source line connection patterns 430 and 455 are connected to the base conductive layer 305 and a source line (not illustrated), respectively. The nonvolatile memory device may further include a channel contact layer 380 and a bit line connection pattern 450, which are disposed in and above the first trench, respectively, and are connected to the channel layer 365 and a bit line (not illustrated), respectively.

The nonvolatile memory device according to an embodiment may include the horizontal gate electrode layers 410a, 410b, 410c, 410d, 410e, and 410f, each of which is a part of a plurality of memory cell transistors. Further, the nonvolatile memory device may include the vertical gate electrode layer 345, which is shared by the plurality of the memory cell transistors.

The horizontal gate electrode layers 410a, 410b, 410c, 410d, 410e, and 410f may be connected to different word lines (not illustrated), respectively. For example, the horizontal gate electrode layers 410a, 410b, 410c, 410d, 410e, and 410f may each be connected to a different word line. The horizontal gate electrode layers 410a, 410b, 410c, 410d, 410e, and 410f may independently control the polarization state of the adjacent ferroelectric layer 355 according to voltages applied through the word lines. Accordingly, a channel resistance of each channel layer 365 of each of the plurality of memory cell transistors can be independently controlled. As a result, a string formed by vertically stacking the plurality of memory cell transistors may store a plurality of different channel signals. Therefore, a memory device including the string may store multilevel signals.

Embodiments of the present disclosure have been disclosed above for illustrative purposes. Those of ordinary skill in the art will appreciate that various modifications, additions and substitutions are possible, without departing from the scope and spirit of the present disclosure as disclosed in the accompanying claims.

What is claimed is:

1. A nonvolatile memory device comprising:
   a conductive substrate structure;
   a stacked structure disposed on the conductive substrate structure, the stacked structure including at least one interlayer insulating layer and at least one horizontal gate electrode layer alternately stacked with the at least one interlayer insulating layer;
   a first trench extending through the stacked structure and into the conductive substrate structure;
   a vertical gate electrode layer disposed directly on a side wall of the first trench and contacting the at least one interlayer insulating layer and the at least one horizontal gate electrode layer;
   a ferroelectric structure disposed on the vertical gate electrode layer; and
   a channel layer disposed on the ferroelectric structure.

2. The nonvolatile memory device of claim 1, further comprising:
   a second trench extending through the stacked structure and into the conductive substrate structure;
   a source line connection pattern disposed in the second trench, the source line connection pattern being electrically insulated from the vertical gate electrode layer, and being connected to the conductive substrate structure and to a source line; and
   a bit line connection pattern disposed over the first trench and connected to the channel layer and a bit line.

3. The nonvolatile memory device of claim 1, wherein the at least one horizontal gate electrode layer comprises at least one of a metal, a metal nitride material, a metal carbide material, and a metal silicide.

4. The nonvolatile memory device of claim 1, wherein the vertical gate electrode layer comprises a doped silicon layer covering the side wall of the first trench.

5. The nonvolatile memory device of claim 1, wherein the ferroelectric structure comprises at least one selected from the group consisting of hafnium oxide, hafnium silicon oxide, zirconium oxide, and zirconium silicon oxide.

6. The nonvolatile memory device of claim 1, wherein the channel layer comprises a doped silicon layer.

7. The nonvolatile memory device of claim 1, wherein the at least one horizontal gate electrode is connected to a plurality of different word lines, respectively, and
   wherein a polarization state of a portion of the ferroelectric structure adjacent to the at least one horizontal gate electrode layer is independently controlled according to a voltage applied through each of the different word lines.

8. The nonvolatile memory device of claim 3, wherein the at least one horizontal gate electrode layer comprises at least one selected from the group consisting of a tungsten (W), titanium (Ti), copper (Cu), a tungsten nitride material, a titanium nitride material, a tantalum nitride material, tungsten carbide, titanium carbide, tungsten silicide, titanium silicide, and tantalum silicide.

9. The nonvolatile memory device of claim 5, wherein the ferroelectric structure includes a dopant comprising at least one selected from the group consisting of copper (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Gd).

* * * * *